United States Patent [19]

Brunner et al.

[11] Patent Number: 5,470,681
[45] Date of Patent: Nov. 28, 1995

[54] PHASE SHIFT MASK USING LIQUID PHASE OXIDE DEPOSITION

[75] Inventors: Timothy A. Brunner, Ridgefield, Conn.; Derek B. Dove, Mt. Kisco; Louis L. Hsu, Fishkill, both of N.Y.

[73] Assignee: International Business Machines Corporation, Armonk, N.Y.

[21] Appl. No.: 173,394

[22] Filed: Dec. 23, 1993

[51] Int. Cl.$^6$ ................................................ G03F 9/00
[52] U.S. Cl. ...................... 430/5; 430/313; 430/315; 430/324; 430/325
[58] Field of Search ................................ 430/5, 313, 315, 430/324, 325

[56] References Cited

U.S. PATENT DOCUMENTS

| | | | |
|---|---|---|---|
| 4,463,073 | 7/1984 | Miyauchi et al. | 430/5 |
| 4,923,772 | 5/1990 | Kirch et al. | 430/5 |
| 5,032,491 | 7/1991 | Okumura et al. | 430/314 |
| 5,057,399 | 10/1991 | Flaim et al. | 430/313 |
| 5,100,503 | 3/1992 | Allman et al. | 430/5 |
| 5,126,220 | 6/1992 | Tokitomo et al. | 430/5 |
| 5,128,233 | 7/1992 | Beisswenger et al. | 430/271 |
| 5,153,035 | 10/1992 | Sakai et al. | 427/430.1 |
| 5,153,103 | 10/1992 | Kotachi et al. | 430/296 |
| 5,178,989 | 1/1993 | Heller et al. | 430/323 |
| 5,270,233 | 12/1993 | Hamatake | 437/44 |

FOREIGN PATENT DOCUMENTS 39-3663    1/1964    Japan .
3244126    3/1991    Japan .

OTHER PUBLICATIONS

IBM Technical Disclosure Bulletin, vol. 35, No. 4A, Sep. 1992; "Process Scheme to Make Shallow Trench Isolation Without Chemical Mechanical Polishing"; pp. 213–215.

Primary Examiner—S. Rosasco
Attorney, Agent, or Firm—Whitham, Curtis, Whitham & McGinn; Alison D. Mortinger

[57] ABSTRACT

Selective deposition of silica from a liquid phase solution of silica in hydrofluorosilicic acid through openings in a pattern of polyimide or similar organic material provides an optically improved phase shift mask structure for making lithographic exposures since deposition can be made substantially anisotropic to yield deposits of substantially uniform thickness. Deposition from the liquid phase is readily controlled and highly predictable control of deposition rate can be achieved by control of temperature of a low temperature deposition process. Therefore the optical quality of the mask need not be compromised by other structures, such as etch stop layers, otherwise necessary to achieve high phase shift accuracy and the deposits of phase shift material are substantially homogeneous. The process of deposition from the liquid phase can be stopped and started at will and the mask can be fabricated by a process which is substantially free from material-dependent or material-based process restrictions. The index of refraction of the deposited material can also be adjusted by annealing.

18 Claims, 4 Drawing Sheets

PHASE SHIFT MASK USING LIQUID PHASE OXIDE DEPOSITION

BACKGROUND OF THE INVENTION

CROSS-REFERENCE TO RELATED APPLICATIONS

This application is related to concurrently filed U.S. patent applications Ser. Nos. 08/173,396 (Attorney's Docket No. FI9-93-004) and 08/173,383 (Attorney's Docket No. FI9-93-005), both of which are assigned to the assignee of the present invention which are hereby fully incorporated by reference herein.

1. Field of the Invention

The present invention generally relates to high resolution photolithography and, more particularly, to improved fabrication methods for high performance masks for use in making photolithographic exposures.

2. Description of the Prior Art

The formation of fine patterns of conductors and other portions of circuit elements is an indispensable part of the fabrication of integrated circuits and other electronic devices, such as multi-layer modular circuits which may contain many such integrated circuits and other devices which are connected by conductive patterns on lamina thereof. Photolithography techniques are well-known and highly developed for the production of such patterns.

In general, photolithography involves the application of a photosensitive resist material to a surface of a lamina, substrate or partially formed integrated circuit and the exposure of a portion of the photosensitive resist material in accordance with a desired pattern. The pattern is then developed by selective removal of either the exposed or unexposed portion of the resist (depending on whether the resist material is a positive or a negative resist) allowing material to be selectively removed or deposited in accordance with the remaining pattern of resist material.

The exposure of the photoresist material is often accomplished by the projection of light or other radiation (e.g. at ultra-violet and shorter wavelengths) through a mask since a mask permits a high degree of accuracy, repeatability and convenience as compared to direct writing of the pattern. The quality of the mask therefore determines and limits the quality of the developed pattern of resist material. While very high quality mask patterns have been developed, however, some optical effects have further limited resist exposure quality.

Specifically, due to the wave-like nature of light and other forms of radiation suitable for photolithography processes, diffraction and other interference effects occur at the edges of opaque areas of the mask and may cause a dimensional change (or produce ghost patterns) in the exposed pattern since the opaque regions of the mask cannot be placed directly in contact with the photo resist during exposure. In practice, it is customary to project the image using an optical system of substantial length in order to achieve a reduction of the size of the pattern at the resist surface relative to the size of the mask, often by a factor of four or more. These effects therefore cause some spreading of the exposed image or even the exposure of additional regions of the photoresist corresponding to lobes of energy radiating at an angle to the plane of the mask from an aperture therein, depending on the separation of the opaque regions of the mask from the photoresist (e.g. the distance over which the pattern image is projected).

While this effect is generally dimensionally small, recent increases in integration density of integrated circuits has pushed minimum feature sizes of patterns into regimes where the effect has become significant and often critical to high manufacturing yields. Therefore, to improve exposure patterns, a so-called rim phase-shift mask has been developed in order to limit image spreading in exposure of features of closed shape. A similar phase-shift mask formation known as a Levenson-type shifter is used for exposure of periodically repeated patterns, such as arrays of parallel conductors.

Essentially, such rim phase-shift masks provide an altered optical path length through the mask at the edge or rim of the opaque pattern formed in the mask. A Levenson-type phase shift structure provides a similar effect with differing path lengths between opaque regions which enhances contrast of repeated patterns, such as parallel lines. In a rim phase-shift mask, the difference in path length usually is designed to provide a 180° relative (to 0°) phase shift of the radiation at the wavelength at which the exposure is made. Levenson-type and similar shifters usually are designed to provide several amounts of relative phase shift such as 90° and 180°. This relative phase shift causes an interference effect which slightly narrows the exposure pattern at the photoresist surface relative to the size of an aperture formed in the mask and reduces the intensity of radiation beyond the edges of the aperture (e.g. the energy in the side lobes) such that any exposure which occurs beyond the dimensions of the mask aperture is insufficient to be developed.

While rim phase-shift masks have been made and effectively used, the fabrication of the masks has been difficult and expensive due to the need to form extremely small regions having differing optical lengths at the edges of opaque regions. That is, either patterning must be done within the mask pattern or the opaque regions of the mask must be recessed from the regions of differing optical path length. Additionally, the amount of phase shift is critical to the performance of the mask in order to attenuate side-lobes of radiation due to diffraction. While a phase shift of 1800 is generally sufficient for a rim phase shift mask which is used to form closed shapes, other phase shift structures, such as Levenson-type phase shifters which are used to form arrays of parallel conductors employ a sequence phase shift regions having relative phase shifts of 0°, 90°, 180° and 90° between parallel opaque mask areas.

In either case, the phase shift is often obtained by etching a substrate to corresponding depths to alter the optical path length through the substrate or other transparent mask material. However, preferred methods of anisotropic etching, such as reactive ion etching (RIE) proceed at rates which are subject to wide variation which is not readily controlled. A tolerance of 15% in blind etching depth is generally regarded as the highest accuracy which can be consistently attained even under the most stringent of process conditions.

To obtain higher accuracy for high-performance phase-shift structures, an etch stop layer can be used. However, an etch stop layer must necessarily be of a different material than the transparent regions of the mask and a close match of refractive indices between the etch stop material and the substrate or other transparent material of the mask is usually impossible. This mismatch of refractive indices causes a partially reflective interface which reduces the transparency of the mask, reduces exposure efficiency and complicates mask design, particularly where several etch stop layers must be employed to obtain several different phase shifts because of different degrees of transparency which are thus produced. Also, when an etch stop region remains embedded in the mask, two interfaces are produced by each etch stop layer so embedded. Differing transparencies of areas for each amount of phase shift desired is thus usually unavoidable and further complicates mask design. While amounts of transmitted and reflected light can be equalized to some degree by careful control of the thicknesses of the etch stop and transparent material layers in the mask, such control is difficult and expensive as well as complicating of the mask design.

Spin-on glass (SOG) is sometimes also used for the phase shift layer or layers. However, SOG is considered less desirable since thermal treatment is required to remove the organic component of the SOG layer (as well as to relieve some of the stresses induced by the spin on process which alter refractive index of the material). Also, the glass material, itself, is not presently suitable for use in the deep ultraviolet region and shorter wavelengths of the electromagnetic spectrum due to increased absorption of these wavelengths relative to other materials.

Recently, a liquid phase deposition process has been introduced which has successfully deposited silicon oxide on a substrate surface at low temperature. Specifically, silicon oxide has been deposited on a surface at 35° C. using a solution of hydrofluorosilicic acid ($H_2SiF_6$) and boric acid ($H_3BO_3$) which is supersaturated with silica ($SiO_2$), as disclosed in "A New Process for Silica Coating" by Hirotsuga Nagayama et al., published in the Journal of the Electrochemical Society, August, 1988, pp.2013–2016, which is fully incorporated by reference. In summary, the solubility of silica is said to decrease with increasing temperature and a saturated solution can be made supersaturated by increasing temperature. However supersaturation is achieved, the excess silica is then deposited on a surface immersed in the supersaturated solution while the concentration of resulting hydrofluoric acid is minimized by reaction with the boric acid.

While the possibility of low temperature oxide deposition by liquid phase silica deposition is attractive for forming insulators between interconnect layers, heat treatment at 500° C. or higher (essentially an annealing process to form a more orderly silica network of increased density) has been found to improve dielectric quality and increase density of the oxide with some increase in refractive index. However, these temperatures are not feasible where metal deposits (e.g. for conductors) or critical distributions of dopants or impurities are present since temperatures above 350° C. will damage or destroy the integrity of metal conductors and cause accelerated levels of diffusion of dopant or impurity materials. Some selectivity of deposition of silica from the liquid phase using the process disclosed in the above incorporated article has also been reported: "A New Interlayer Formation Technology of Completely Planarized Multilevel Interconnection by Using LPN" by T. Homma et al., published in the 1990 Symposium of VLSI Technology suggests that a difference in wettability between the resist and the intended deposition surface can improve selectivity of deposition. However, the profiles of deposits shown in micrographic images published therein exhibit relatively large variations in thickness, particularly at edges of deposits, which would render them largely useless for phase-shift mask features or other optical applications where optical path length through the deposit was of importance.

SUMMARY OF THE INVENTION

It is therefore an object of the present invention to provide a phase-shift mask structure which can be produced using liquid phase deposition of silicon oxide and in which liquid phase deposition of optical material is particularly advantageous.

It is another object of the invention to provide a phase shift mask structure which can be readily formed with improved accuracy.

It is a further object of the invention to provide a phase-shift mask structure which can be formed at high accuracy without compromise of transparency or complication of design.

In order to accomplish these and other objects of the invention, a method of forming a lithographic exposure mask is provided including the steps of applying a pattern of material having openings therein to a substrate which is transparent to at least one form of lithographic exposure radiation, and selectively depositing silica in the openings to a first thickness from a supersaturated solution of silica in hydrofluorosilicic acid.

In accordance with another aspect of the invention, a lithographic exposure mask is provided including a substrate which is transparent to at least one form of lithographic exposure radiation and having a first refractive index, a pattern of phase shift deposits of material on the substrate which are substantially homogeneous and of substantially uniform thickness.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
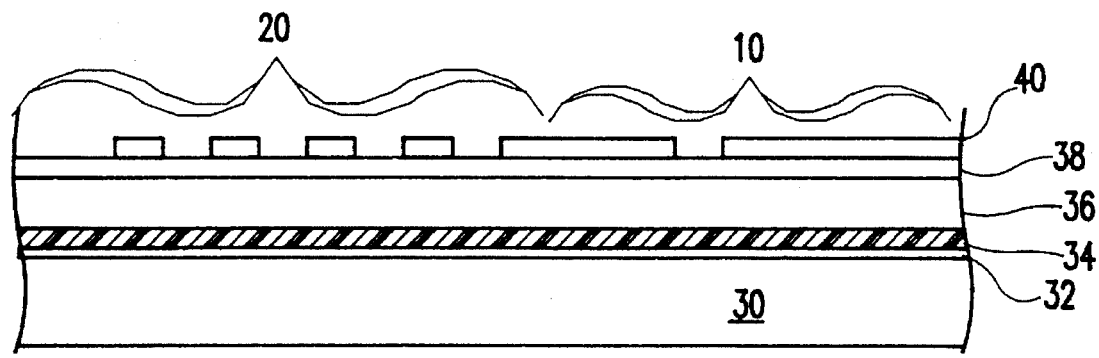
FIGS. 1A, 1B, 1C, 1D, 1E, 2, 3 and 4 illustrate major stages in fabrication of an arbitrary phase-shift mask structure in accordance with a preferred embodiment of the invention.
Figure 1B:
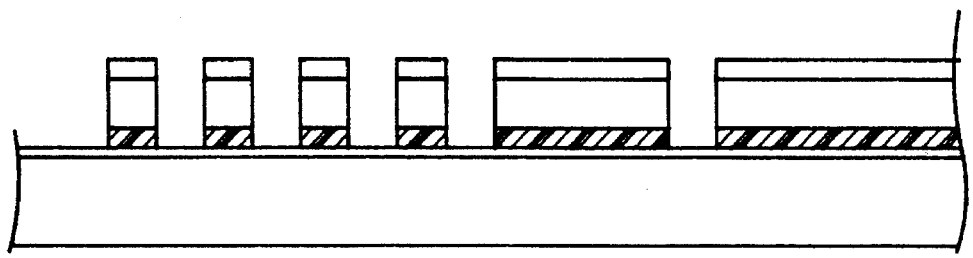
Figure 1C:
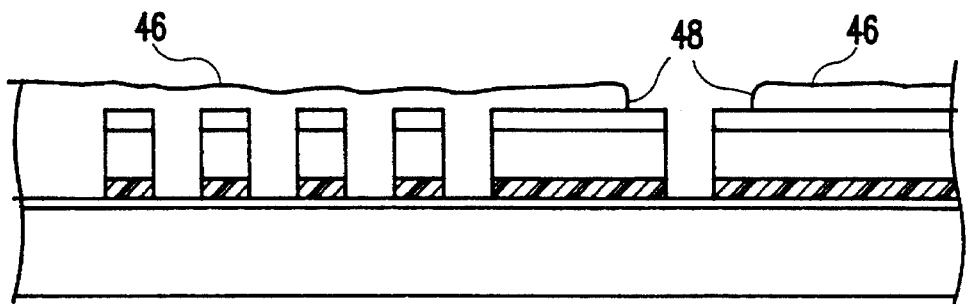
Figure 1D:
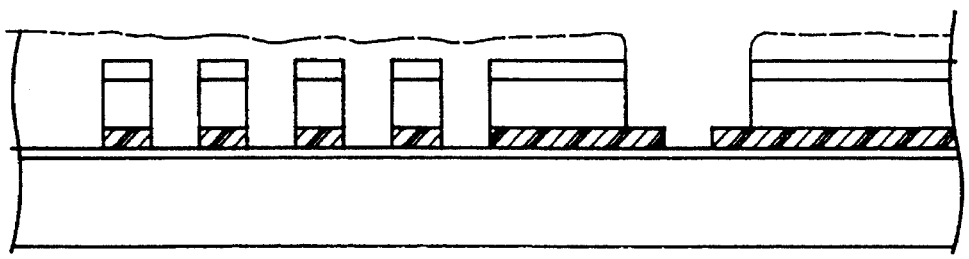
Figure 1E:
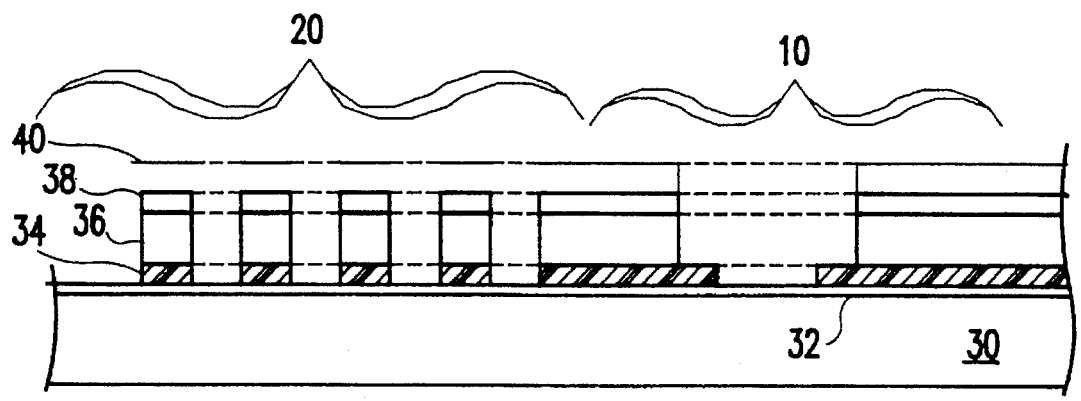

Referring now to the drawings, and more particularly to FIG. 1E, there is shown an early stage of the fabrication of an arbitrary phase-shift mask structure in accordance with the invention. Geometries of rim phase shift mask features and other structures such as Levenson-type phase shifters are well understood in the art and it is to be understood that the structures shown in FIGS. 1A–4 and 5A–10 are generalizations of these geometries and structures to demonstrate the general applicability of the invention to all such structures which rely principally on the production of two or more different optical path lengths in discrete regions which can be accurately defined. It is therefore not intended to portray any particular type of phase-shifting optical structure although the regions of the arbitrary structure shown which are relevant to or could be used as rim phase shifters (e.g. region 10) or Levenson-type shifters (e.g. region 20) or other types of phase shift structures will be evident to those skilled in the art, as will be the technique of fabricating specific mask features in accordance with those types of designs in light of the following description of the invention.

More specifically, FIG. 1E shows a state of fabrication in which a substrate 30 has been coated with, in order, an optional conductive thin film 32, an opaque mask material 34, a relatively thick polyimide layer 36, a barrier dielectric layer 38, and a resist layer 40 as shown in FIG. 1A and by both solid and dashed lines in FIG. 1E. All of these layers above the conductive thin film are patterned by first patterning the resist layer in accordance with the desired pattern of opaque material in region 20 and the central feature shape in region 10 for the particular type of rim phase shift mask structure illustrated (corresponding to that of FIGS. 3a–3c in the above-incorporated application 08/173,383 (Attorney's Docket No. FI9-93-005), although it is to be understood that other rim phase shift structures may also be formed by variations of the masking patterns appropriate to those structures, as will be evident to those skilled in the art in view of this description).

The material of the substrate of the mask is not critical to the practice of the invention but should be substantially transparent to the wavelength of radiation which will be used to make lithographic exposures using the mask fabricated in accordance with the invention and should have an index of refraction which is close to 1.43. This index of refraction is approximately the refractive index of the silicon oxide which will be deposited but which may be adjusted somewhat by heat treatment as will be discussed in greater detail below.

Likewise, the details and material of the conductive thin film 32 is not critical to the practice of the invention since its function is simply to assist in discharge of electrons (e.g. produced by forward scatter and other effects) during electron beam exposure of resist if such an exposure medium is used. While chrome is generally preferred as an opaque material other metals or materials can also be used. A thickness of the opaque material layer is generally about 800 Angstroms but thicker or thinner layers are possible. The thickness is only important to the practice of the invention when the phase shift structure is similar to structures formed in accordance with FIGS. 3a through 3c and 6a through 6c of concurrently filed U.S. patent application Ser. No. 08/173, 383, (Attorney's Docket No. FI9-93-005) which is fully incorporated by reference above. It is preferable but not required that some metals which may be used for the opaque layer and chrome, in particular, be oxidized to reduce reflectivity prior to deposition of the remaining layers.

Polyimide is preferred for layer 36 but other inorganic polymers which do not support deposit of silica from the liquid phase, (as described in concurrently filed U.S. patent application Ser. No. 08/173,396 (Attorney's Docket No. FI9-93-004), incorporated by reference above) can also be used. The barrier dielectric layer 38 (e.g. nitride) and resist layer 40 are conventional materials for the purpose and many suitable materials are known to those skilled in the art.

After the above-discussed layers have been deposited, the resist layer 40 is exposed in a manner appropriate to the resist material (e.g. by exposure to light (including deep ultraviolet wavelengths), X-rays, electron beam, etc.), the resist is developed to selectively remove either exposed or unexposed regions as shown in FIG. 1A. Then the layers 38, 36, and 34 removed in succession by a sequence of etching processes using, for example, $CF_4$ for layer 38, $O_2$ reactive ion etch (RIE) for layer 36 and $Cl_2$ plasma etch for chrome, if chrome is used for the opaque layer as shown in FIG. 1B. Then, another blanket layer of resist 46 is applied and patterned at the rim phase shift structure and the first two of the above-mentioned etching steps are repeated to remove layers 38 and 36, exposing the edge of the opaque material layer 34 in region 10, as shown in FIG. 1D.

The remaining resist 46 is then removed to complete the mask to the state shown in FIG. 1E. It is to be understood that the above described process steps illustrated in FIGS. 1A–1D are not critical to the practice of the invention and other sequences of steps can be used to arrive at a structure similar to that of FIG. 1E, including variations thereon which are dictated by the design of particular masks and structures of features therein. Therefore, the above-described processes are to be considered as only exemplary of a process sequence consistent with a preferred form of the invention and which are described in the interest of completeness and clarity.

Figure 2:
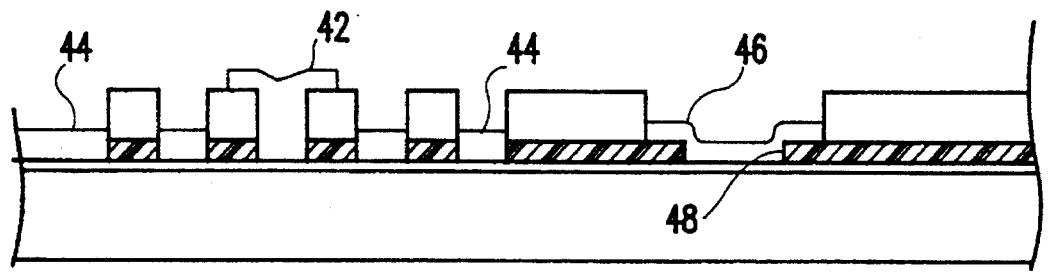

Referring now to FIG. 2, the remaining resist (which would remain as shown in FIG. 1E if not removed during rim phase-shift structure processing steps shown in FIGS. 1B–1D) is removed during RIE of the polyimide 36 and the barrier dielectric is then etched away by a $CF_4$ plasma etch or any of a number of wet processes (but which are not preferred) and regions of the mask which are to have 0° relative phase shift are masked by depositing and patterning a first resist pattern, as shown at 42. It should be noted in this regard that the required resolution and registration accuracy for this patterning has a tolerance approximately equal to the minimum feature size to be produced in the mask which can be reliably achieved. It should be further noted that some masking could also be done in the rim phase shift region 10, depending on the design of the rim phase shift feature, such as in the embodiments identified as "Related Art" in U.S. patent application Ser. No. 08/173,383 (Attorney's Docket No. FI9-93-005). As a matter of terminology, it should also be noted that, in rim phase shift features, the central region thereof is commonly referred to as "0° phase shift" area or region but such nomenclature should not be taken to require that masking should be applied to such an area since the phase shifts obtained are relative.

To complete the mask to the stage shown in FIG. 2, an oxide is then deposited on the unmasked regions of the substrate (or conductive layer, if provided) to an arbitrary depth corresponding to a desired amount of phase shift in accordance with a particular mask design (e.g. in this case, the minimum amount of phase shift provided in the design) but which will be referred to hereinafter as a 90° phase shift region 44. Oxide deposition from the liquid phase proceeds slowly and varies very predictably with temperature. Since deposition process temperatures are low and generally near room temperature, the process temperature can be very accurately monitored and/or controlled and, consequently, high accuracy of deposit thickness can be readily obtained even without monitoring the progress of the deposition process. (If monitoring is done, the process can be stopped and restarted as necessary and complex arrangements for "real-time" monitoring while the deposition process is continuing are not necessary, but are nevertheless feasible, if desired. By the token, the completed mask can be tested and adjusted or repaired in numerous ways including further masking and deposition.) As indicated above, oxide is selectively deposited thereon but oxide does not deposit from the liquid phase on the polyimide or masked regions. Therefore, deposition proceeds substantially anisotropically from the bottom of openings in the polyimide. It should be noted that, at this point, equal depths of oxide, forming surfaces which are substantially planar (e.g sufficiently optically flat to produce accurate phase shifts over the entire deposit surfaces) due to the substantially anisotropic deposition, have been deposited at all unmasked regions except regions 46 at the edges 48 of the exposed opaque material in the rim phase shift feature. Reference is made to U.S. patent application Ser. No. 08/173,396 (Attorney's Docket No. FI9-93-004) for a discussion of the development of the deposit profile during filling of a trench, which should be taken into account on some designs where the opaque material layer is particularly thick or particularly thin. (In particular, it should be noted that in the rim phase shift feature 10 shown in FIGS. 3 and 4 (which is similar to the embodiment of FIG. 3c of U.S. patent application Ser. No. 08/173,383 (Attorney's Docket No. FI9-93-005), although the thicknesses shown are not similarly scaled), the thickness of the opaque material determines the difference in path length as an increased depth of deposit is achieved the edges thereof. Since deposition is neither entirely isotropic nor conformal, as discussed in U.S. patent application Ser. No. 08/173,383 (Attorney's Docket No. FI9-93-004), additional depth of deposit, within the limitation of adequate transparency and ultimate deposition profile, can be used to adjust the width of the "rim" in such a design.)

Figure 3:
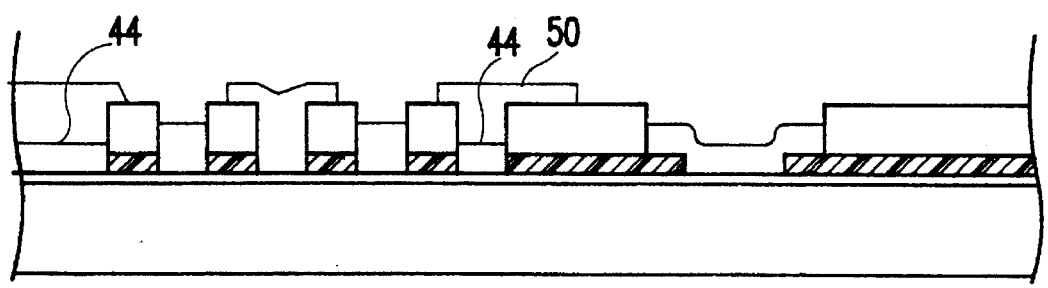

Referring now to FIG. 3, regions such as 90° phase shift regions 44, in which the design depth of deposited oxide has been achieved are masked with a further deposition and patterning of a layer of resist 50 which is preferably the same as or compatible with the resist 42 described above. To assure that resist is removed from areas where further oxide deposition is desired, a short de-scum etch is preferably done at this point and could also be done after the first resist pattern is applied. Some erosion of the resist will occur during this etch but is generally tolerable if adequate thicknesses of resist are used, as will usually be the case. It should be noted that the resolution and registration tolerance in generally the same as previously described. Masking is generally not required in the rim phase shift area 10 since such features usually contain structures nominally producing only phase shifts of 0° and 180°. Then the liquid phase deposition process is resumed until an additional arbitrary amount of deposition depth is achieved in remaining unmasked areas which will hereinafter be referred to as 180° phase shift regions.

Figure 4:
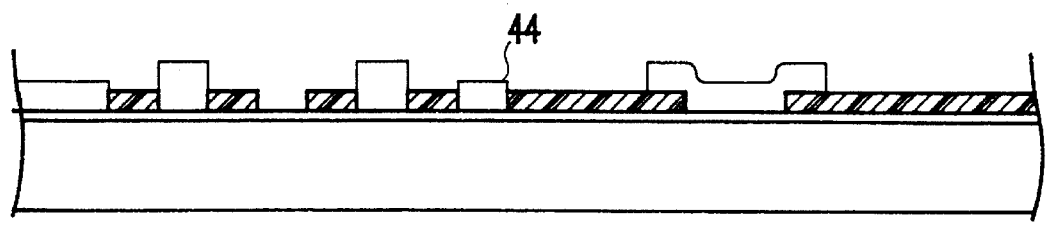

The mask in accordance with the invention is then completed by stripping of the resist 42, 50 and polyimide layer 30, resulting in the structure of FIG. 4. This completed mask alternates opaque regions with transparent regions of three different optical path lengths in region 20. If additional path lengths are desired in the design, the process described with reference to FIG. 3 can be repeated as often as desired and any oxide deposition process can be halted and resumed for assessment of the deposit thickness as described above. Even after the mask is completed, a further deposition process can be performed, with or without masking, to achieve increased deposit depth. By the same token, zincs only opaque material and deposited oxide are exposed, selective etching of the oxide can be done, again with or without masking, to reduce deposit depth to adjust the performance of the mask and conform the mask to the design.

It should also be noted that heat treatment by annealing densifies and slightly alters the refractive index of the material. Densification, of course, will reduce the thickness of the deposited material and thus reduce the amount of phase shift produced although this will be somewhat counteracted by increase in refractive index. Nevertheless, this phenomenon provides a mechanism for fine tuning both the optical path length in a proportional manner (e.g. a correction for a 90° phase shift region would be half that of a 180° phase shift region) while the optical path length of the 0° phase shift region may or may not be changed at all, depending on the substrate material. Annealing may also be used in some circumstances to fine tune the match of refractive index between the substrate and the deposited material to minimize the interface and maximize transparency, although this effect is expected to be very small. However, if it is contemplated that annealing may be desirable, the material of the opaque layer 34 should be chosen to withstand a temperature of about 300° C. for an extended period of time without damage or distortion due to melting or detachment from the substrate. Chrome is considered to be suitable for these conditions. Accordingly, treatments to improve adhesion of the opaque material to the substrate which are otherwise known in the art are also advisable in such a case.

Other forms of mask structure will now be discussed with reference to FIGS. 5A–9. This form of the invention differs principally from that described above by the application of opaque material after formation of the phase shift regions, if at all. (FIGS. 5A–8 assume a mask structure without metal while FIG. 5B shows a variation of FIG. 5A appropriate to application of metal after formation of the phase shift structure, as shown in FIG. 9.) Therefore, these variations of the invention can potentially avoid material-based temperature restrictions on the annealing process, if the annealing process is desired. Further, many mask designs do not require opaque regions or are not particularly critical as to the boundary of the opaque regions due to the phase shift structure and in which the variation of the invention shown in FIGS. 5A–8 may be particularly advantageous.

It should also be understood from the following discussion that while the mask structure in region 20' will be substantially identical to that of region 20 in FIGS. 1–4, the rim phase shift mask structure region follows that of FIGS. 5a–5e of the above-incorporated Ser. No. 08/173,383, (Attorney's Docket No. FI9-93-005) as to which it is particularly advantageous in limitation of process steps and freedom from material based restrictions. However, any Of the other structures disclosed therein as well as other designs could also be formed by the process of FIGS. 5A–9 although some initial metallization with high temperature-tolerant material or application of other opaque material may be required which may require additional process steps, as will be evident to those skilled in the art, an correspondingly reduce the relative advantages to be obtained from this variation of the invention.

Figure 5A:
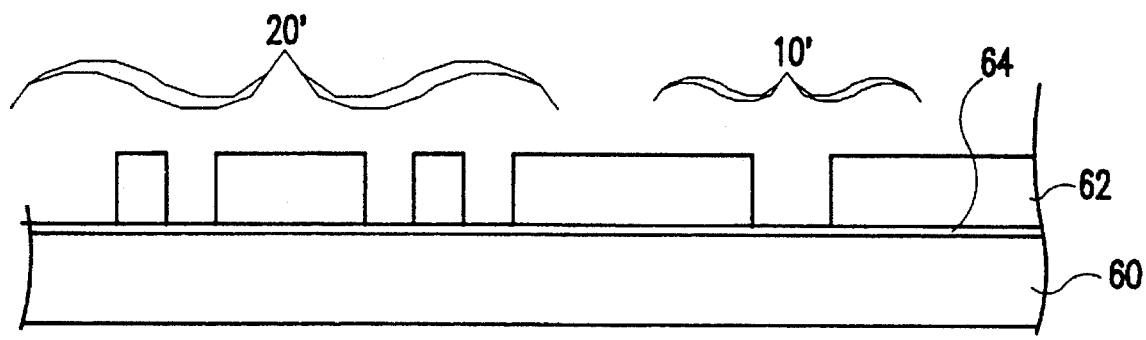
FIGS. 5A, 6, 7 and 8 illustrate major stages in fabrication of another arbitrary phase-shift mask structure in accordance with a further embodiment of the invention, FIGS. 5B and 9 (which is a sectional view of FIG. 10) illustrate a variation of the sequence of FIGS. 5A, 6, 7 and 8 which includes metal patterns.
Figure 5B:
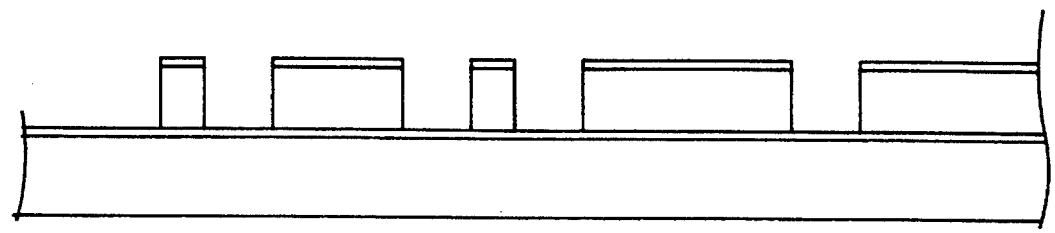

Referring now to FIG. 5A, an early stage of the production of a variant form of the invention, comparable to that of FIG. 1E, is shown. This stage of production is achieved by applying a blanket layer of polyimide 62 after an optional thin transparent blanket layer or conductive material 64 as a discharge layer if electron beam exposure is to be used. The materials and order of application are not critical to the practice of the invention but polyimide materials are preferred for the resist since silica will not be deposited from the liquid phase on polyimide. For this reason, the deposition will progress substantially anisotropically to provide a substantially flat deposit profile. These layers are then patterned in the normal way to expose substrate 60 in regions which are to receive phase shift layer(s), such as by the sequence of etches after resist exposure and development, as described above. It should, however, be noted that no opaque material has yet been applied and the patterning includes masking of the 0° phase shift areas and thus the patterning corresponds to that of FIG. 2 (avoiding the process steps involved in applying resist 42).

The mask is then placed in a solution of hydrofluorosilicic acid, as described above, and the deposition allowed to proceed, as above, until a first design thickness of deposit is obtained. As before, the deposition process proceeds relatively slowly and quite predictably and a desired thickness can be readily and accurately achieved with or without periodic or in situ monitoring of the process. The process can be interrupted and restarted at will, as before. If only a single phase shift thickness of deposit is required in a design, the mask can be completed by merely stripping of the resist 62, followed by a mild bake to dry end stabilize the deposited layer (and annealing, if desired).

Figure 7:
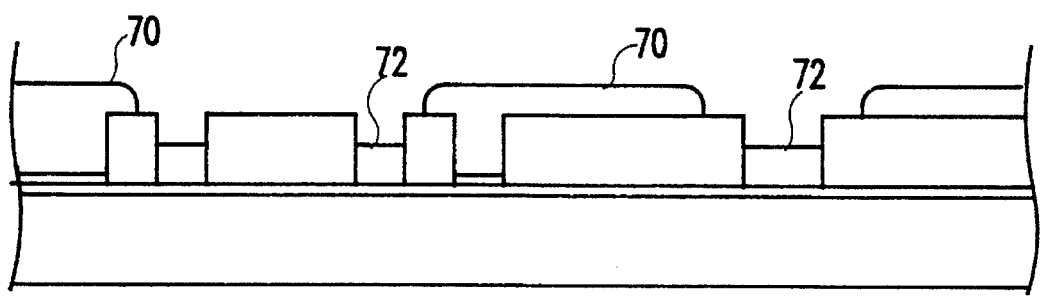

For purposes of illustration, however, it is assumed that two or more amounts of phase shift are specified by the design. If so, deposition of layer 68 is terminated after a thickness sufficient to produce the smallest amount of phase shift specified by the design is achieved (e.g. 90°). Then, as shown in FIG. 7, those areas where deposition is complete are masked by application and patterning of resist 70. This resist is even less critical to the practice of the invention than resist 62 since deposition of silica thereon will not affect the further deposition in unmasked areas and the resist 70 will be removed with the stripping of resist 62. Further, it should be noted that the patterning of resist layer 70 does not require high resolution or accuracy of registration since it overlies layer 62. The liquid phase deposition process can then be resumed until the next larger thickness of deposit 72 specified by the design is achieved. It should be noted that if three or more thicknesses are required by the design, some masking economies can potentially be derived by scheduling depositions by common increments of thickness: stripping resist layer 70 while resist layer remains in place and remasking in accordance with common increments of thickness to be deposited. That is, deposition can be interrupted at selected locations by masking and resumed after stripping of resist 70 (while masking other areas with a similar resist layer). These masking, patterning and deposition steps can be repeated as often as required to develop the number of different phase shifts specified by the design.

When all different thicknesses have been developed, remaining polyimide 62 is stripped and the mask is preferably given a mild bake to stabilize the deposited material. Then, if desired, the mask can be annealed to increase and stabilize the refractive index of the deposited material. It should be noted that there are no material-based constraints on annealing if no initial application of opaque material is required by the design since only the deposited phase shift oxide material remains on the substrate.

Figure 6:
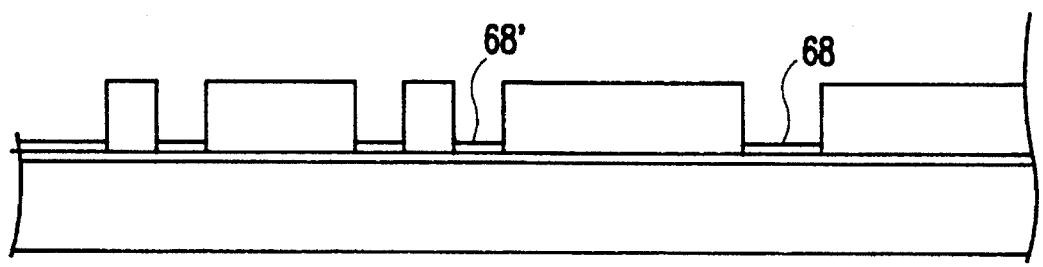

If opaque materials are required by the design, it is preferred that the early stage of the fabrication shown in FIG. 5A be slightly altered in dimensions as shown in FIG. 5B. In this case, the patterning of resist layer 64 should allow slightly wider openings for deposition of phase shift material. Otherwise the structure is precisely the same as that shown in FIG. 5A and the above discussion thereof is fully applicable to FIG. 5B. Likewise, the process described in connection with FIGS. 6–8 is entirely applicable to the structure of FIG. 5B and need not be repeated.

Figure 8:
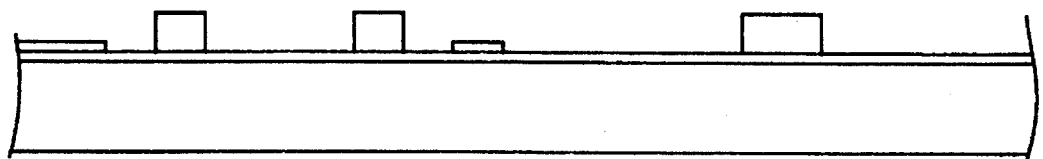
Figure 9:
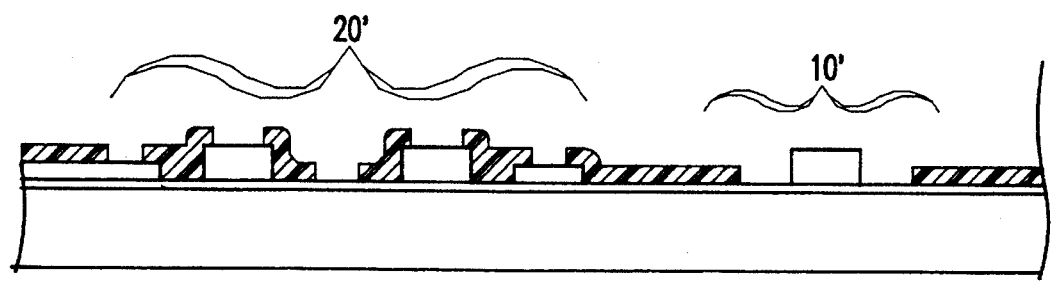

Once the state of manufacture of FIG. 8 is reached, a blanket layer of metal or other opaque material 74 may be applied, preferably by sputtering, yielding isotropic deposition which serves to cover the sides of the phase shift regions, as shown in FIG. 9, to suppress scattering of light and improve contrast. The layer of opaque material is then patterned by any process appropriate to the opaque material to form openings at the substrate and the phase shift regions. Although this is not a self-aligned process, registration accuracy need only be within the tolerance provided by the increased widths of the phase-shift areas shown in FIG. 5B as compared with FIG. 5A. Therefore, the registration accuracy required is only as great as may be required by the ratio of minimum feature size to minimum feature separation in the lithographic exposure pattern to be produced by the mask. Therefore, registration accuracy may not pose a significant limitation on this process. Since all heat treatment required by the design have already been completed prior to application and patterning of opaque material 74, there are no restrictions on the opaque material or patterning processes which may be employed. A patterned layer of chrome deposited to a thickness of about 100 nm is considered sufficient to the formation of opaque areas. Oxidation of the chrome or other metal layer is also preferred to reduce reflectivity but is not required.

A perfecting feature of the invention will now be described in connection with FIG. 10 which is significant to mask structure design, particularly as between the variations of the invention in order to avoid the provision of opaque materials in the mask design or to simplify the design of opaque material patterning. Specifically, in rim phase shift mask features such as that shown in region 10' of FIG. 9 and at terminations of repeated patterns where a 0° phase shift region may be immediately adjacent to a 180° phase shift region, a ghost pattern may be formed. Therefore, it was previously thought necessary to provide an opaque mask closely registered with such terminations. That is, a relative phase transition of 180°, will form a sharp image of a line. In a closed shape, such as a rim phase shift mask, this will cause formation of only an outline unless the feature to be produced is small. The game problem would, of course, occur in repeated patterns which are extended in one direction but may turn at particular locations and terminate at some locations and masking of particular regions has previously been necessary to suppress ghost images at such terminations or for larger closed shapes. This effect may severely complicate mask design in order to determine the exact bounds of opaque area to suppress ghost images.

However, in view of the ease with which different phase shifts can be obtained through use of the invention, it has been found that ghost images can also be effectively suppressed by the provision of a 90° degree phase shift region instead of an opaque area in portions of the mask. That is, at such terminations of repeated patterns, forming a 90° phase shift region adjacent a 180° phase change location will suppress ghost images without complicated geometry of opaque areas (which are subject to the production of diffraction effects.

Figure 10:
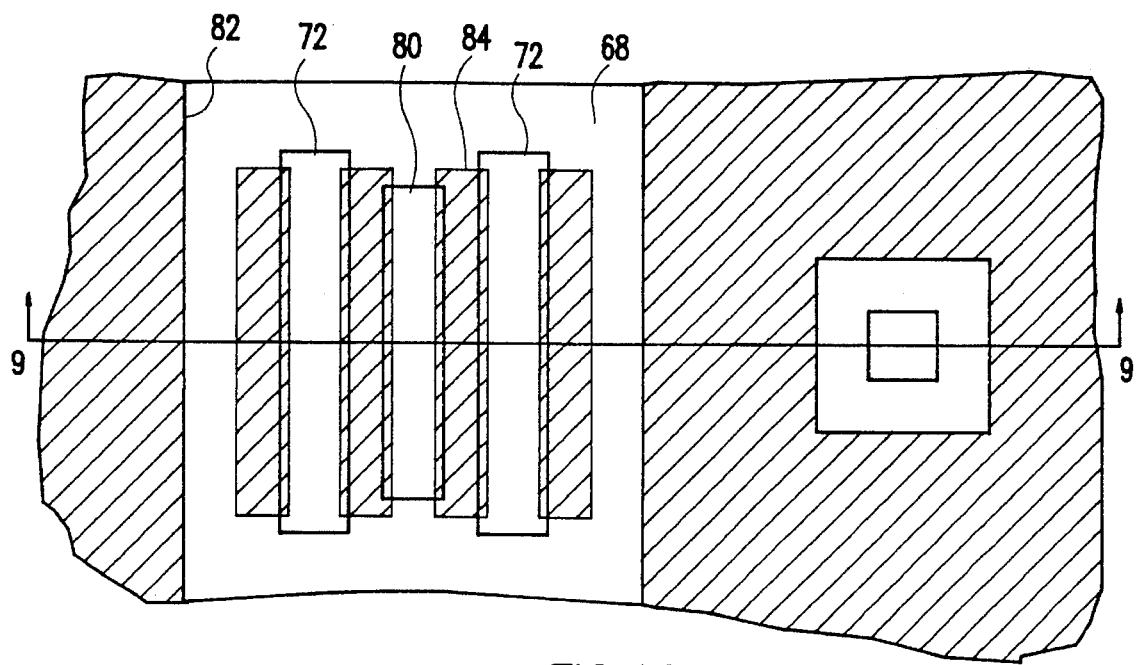
FIG. 10 shows a plan view of a mask as shown in section in FIG. 9 including a perfecting feature of the invention to prevent ghost images at terminations and interruptions of repeated patterns.

As applied to the variation of the invention shown in FIG. 9, FIG. 10 shows, in plan view, how the geometry of opaque areas is simplified. Specifically, it can be seen that the ends of 0° phase shift region 80 is not collinear with the ends of 180° phase shift regions 72 so that the effects of phase will produce an image of lines with substantially collinear terminations. If the mask were to be made to follow these geometries, a high degree of precision in registration and feature size would be required. However, in accordance with this perfecting feature of the invention, the 90° phase shift region 68 can be effectively extended around the ends of the 0° and 180° phase shift regions by the simple expedient of depositing phase shift material to a depth corresponding to the entire region other than 0° phase shift region 80, increasing the thickness to correspond to the 180° phase shift regions 72 with further masking and deposition processes, and further application of opaque material to edge 82 which is spaced from the pattern and much less critical in location. Further, the pattern or opaque material need not closely follow the boundaries of any particular phase shift areas. If required by the mask design, additional regions 84 of opaque material can also be added which are also of simplified geometry. Thus, by surrounding, in plan view, respective phase shift regions which cause the formation of images with a deposit of phase shift material which produces a phase shift of approximately an average of the image-forming phase shift regions (e.g. having a thickness which approximates an average of the thickness of the image-forming deposits) ghost images can be suppressed with increased effectiveness and patterning of opaque material is greatly simplified and reduced in criticality.

In view of the foregoing, it is seen that the invention provides a simplified process for making lithographic exposure masks which are of improved optical performance due to the substantially anisotropic selective deposition of silica to form homogeneous (e.g. without optically significant embedded boundaries or interfaces) phase shift deposits of substantially uniform and accurately controllable thickness from a liquid phase supersaturated solution of silica in hydrofluorosilicic acid. Transparency is not compromised by any structure or formation, such as boundaries or etch stop layers, necessary to the formation of the mask and the process in accordance with the invention is substantially free of any material-based process restrictions.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming a lithographic exposure mask including the steps of applying a pattern of material having openings therein to a substrate which is transparent to at least one form of lithographic exposure radiation, and selectively depositing silica in said openings to a first thickness from a supersaturated solution of silica in hydrofluorosilicic acid.

2. A method as recited in claim 1, wherein said material of said pattern of material applied to said substrate in said applying step is polyimide.

3. A method as recited in claim 2, including the further step of annealing said deposited oxide.

4. A method as recited in claim 1, including the further steps or applying a further pattern of material at least in selected openings in said pattern, and further selectively depositing silica in remaining ones of said openings to a second thickness from a supersaturated solution of silica in hydrofluorosilicic acid.

5. A method as recited in claim 4, including the further step of applying an opaque material to said substrate prior to said applying step.

6. A method as recited in claim 5, including the further step of annealing said deposited oxide.

7. A method as recited in claim 4, including the further step of applying an opaque material subsequent to said further selectively depositing step.

8. A method as recited in claim 7, including the further step of annealing said deposited oxide.

9. A method as recited in claim 4, including the further step of annealing said deposited oxide.

10. A method as recited in claim 1, including the further step of applying an opaque material to said substrate prior to said applying step.

11. A method as recited in claim 1, including the further step of applying an opaque material to subsequent to said selectively depositing step.

12. A method as recited in claim 11, including the further step of annealing said deposited oxide.

13. A method as recited in claim 1, including the further step of annealing said deposited oxide.

14. A lithographic exposure mask including a substrate which is transparent to at least one form of lithographic exposure radiation and having a first refractive index, a pattern of phase shift deposits of material from deposition of said material from liquid phase solution which is transparent to said at least one form of lithographic exposure radiation on said substrate, said deposits each being substantially homogeneous and respective phase shift regions of said deposits being of substantially uniform thickness.

15. A mask as recited in claim 14, further including a pattern of opaque material on Said substrate.

16. A mask as recited in claim 15, wherein said pattern of phase shift deposits and said pattern of opaque material form at least one rim phase shift mask feature.

17. A mask as recited in claim 14, wherein said pattern of phase shift deposits forms at least one phase shift mask feature.

18. A mask as recited in claim 14, wherein respective phase shift regions which form an image are surrounded by a phase shift region having a phase shift which is approximately an average of the phase shifts of said phase shift regions which form an image.

* * * * *